United States Patent

Hatakenaka et al.

[11] Patent Number: 5,910,181
[45] Date of Patent: Jun. 8, 1999

[54] SEMICONDUCTOR INTEGRATED CIRCUIT DEVICE COMPRISING SYNCHRONOUS DRAM CORE AND LOGIC CIRCUIT INTEGRATED INTO A SINGLE CHIP AND METHOD OF TESTING THE SYNCHRONOUS DRAM CORE

[75] Inventors: Makoto Hatakenaka; Akira Yamazaki; Shigeki Tomishima; Tadato Yamagata, all of Tokyo, Japan

[73] Assignee: Mitsubishi Denki Kabushiki Kaisha, Tokyo, Japan

[21] Appl. No.: 08/964,236

[22] Filed: Nov. 4, 1997

[30] Foreign Application Priority Data

Apr. 4, 1997 [JP] Japan ..................... 9-086600

[51] Int. Cl.⁶ ..................................... G06F 11/00
[52] U.S. Cl. ............................................ 714/718
[58] Field of Search .................. 371/21.1, 21.4, 371/21.6; 365/230.03, 230.06, 222, 236

[56] References Cited

U.S. PATENT DOCUMENTS 5,629,898  5/1997  Idei et al. .................. 365/222
5,761,149  6/1998  Suzuki et al. ................ 365/230

FOREIGN PATENT DOCUMENTS 7141870  6/1995  Japan .

*Primary Examiner*—Vincent P. Ganney
*Attorney, Agent, or Firm*—Leydig, Voit & Mayer

[57] ABSTRACT

A semiconductor integrated circuit device includes a logic circuit and a synchronous dynamic random access memory including a core unit, integrated on a single semiconductor chip. The semiconductor integrated circuit device includes a synchronous dynamic random access memory control circuit which receives external control signals for the synchronous dynamic random access memory from the logic circuit, and outputs internal control signals to the core unit of the synchronous dynamic random access memory. For testing of semiconductor integrated circuit device, external test signals are provided through external terminals. The external test signals are selected by a selector, and are provided to the core unit of the synchronous dynamic random access memory for testing.

9 Claims, 15 Drawing Sheets

SEMICONDUCTOR INTEGRATED CIRCUIT DEVICE COMPRISING SYNCHRONOUS DRAM CORE AND LOGIC CIRCUIT INTEGRATED INTO A SINGLE CHIP AND METHOD OF TESTING THE SYNCHRONOUS DRAM CORE

FIELD OF THE INVENTION

The present invention relates to a semiconductor integrated circuit device comprising a synchronous dynamic random access memory (SDRAM) core and a logic circuit which are integrated in a single chip. In particular, the present invention relates to a semiconductor integrated circuit device implementing a high-speed interface between an SDRAM core and a logic circuit thereof and a semiconductor integrated circuit device allowing the SDRAM core to be directly tested from external pins as a stand-alone unit. The present invention further relates to a method of testing the device.

BACKGROUND ART

In recent years, the technology of semiconductor integrated circuits has undergone a revolution aiming at higher integration and higher speeds. This technology is applied to manufacturing of semiconductor products including semiconductor memory devices, such as DRAMs, and semiconductor logic circuit devices, such as microprocessors. Therefore, the technology is positioned for extension to optimized manufacturing of semiconductor devices. Since different manufacturing technologies are embraced for the manufacture of each type of semiconductor device, there are naturally a number of problems encountered in fabricating a semiconductor memory device and a semiconductor logic circuit device on a single semiconductor chip. Under the situation, it is necessary to focus energy on how to resolve new problems for devices on a single chip which are not solved by merely extending the conventional technology. Rather focus must be on universal problems for higher integration and higher speeds. Therefore, the purpose of the present invention is to provide a high speed semiconductor integrated circuit device which comprises a semiconductor memory device and a semiconductor logic circuit device integrated in a single chip.

FIG. 12 is a block diagram of a first example of a typical conventional semiconductor integrated circuit device comprising an SDRAM core and a logic circuit which are integrated in a single chip. As shown in the figure, external input pins 101, which are connected to a logic circuit 102, forward external control signals to an SDRAM unit. The logic circuit 102 is connected to an SDRAM controller 103 which is connected to a general-purpose SDRAM core 104. An external clock input pin 105, one of the external input pins 101, supplies an external clock signal to a clock generating means 106 for feeding an internal clock signal 107 to the logic circuit 102, the SDRAM controller 103 and the general-purpose SDRAM core 104.

The clock generating means 106 is used for generating the internal clock signal 107 synchronized with the external clock signal. The clock generating means 106 may include a simple buffer, a frequency multiplier, or a frequency divider. Since the clock generating means 106 employed in the semiconductor integrated circuit device is a conventional circuit, its explanation is omitted.

The SDRAM core 104 has the same interface as a general-purpose stand-alone SDRAM. To put it in detail, signals such as a row address strobe signal 108 (referred to hereafter as a /RAS signal), a column address strobe signal 109 (referred to hereafter as a /CAS signal) and a write enable signal 110 (referred to hereafter as a WE signal) are decoded by a command decoder, and then decoded signals are input in synchronization with the rising edge of the internal clock signal 107 as a command for controlling the operation of the SDRAM core 104.

The SDRAM core 104 receives the /RAS signal 108, the /CAS signal 109, the /WE signal 110, an address 111 and a data input 112 from the SDRAM controller 103. In response to the /RAS signal 108, the /CAS signal 109, and the address 111, the SDRAM core 104 generates a data output 113 supplied to the SDRAM controller 103.

Examples of commands output by the command decoder as a result of decoding the /RAS signal 108, the /CAS signal 109 and the /WE signal 110 are listed in the following table.

|  | /RAS | /CAS | /WE |
| --- | --- | --- | --- |
| Bank activate | L | H | H |
| Precharge | L | H | L |
| Write | H | L | L |
| Read | H | L | H |
| Refresh | L | L | H |

In the case of a general-purpose stand-alone SDRAM unit, the number of external pins is limited. Thus, a technique for decoding such external control signals is adopted. In this way, detailed commands, such as Bank Activate (ACT) 114, Precharge (PRC) 115, Write 116, Read 117, and Refresh (REF) 118 can be given using a small number of such external signals.

Internal control signals, that is, the Bank Activate (ACT) command 114, the Precharge (PRC) command 115, the Write command 116, the Read command 117, and the Refresh (REF) command 118, output by the command decoder are each supplied to an input synchronizing latch. The internal synchronizing latch receives an internal control signal in synchronization with the internal clock signal 107.

In a timing generation circuit, an internal operation signal required for the operation of the SDRAM core is generated from the signal latched in the input synchronizing latch, supplying the internal operation signal to a memory array. Read-out data output from the memory array in response to the internal operation signal is supplied to an output control circuit.

Data is supplied to the SDRAM core 104 in a write operation and is to be output later in a read operation as a data output 113 from the output control circuit in synchronization with the internal clock signal 107. The data output 113 is supplied to the SDRAM controller 103.

FIGS. 13(A)–13(K) comprise a timing chart showing the operation of the typical conventional semiconductor integrated circuit device shown in FIG. 12. While receiving inputs from the logic circuit 102, the SDRAM controller 103 generates the /RAS signal 108, the /CAS signal 109, the /WE signal 110, an address 111, and a data input 112 synchronized with the internal clock signal 107. When these synchronized signals are produced, a delay time t(control) is generated in the propagation of each of the signals through the SDRAM controller 103. Then, when a synchronized signal is decoded by the command decoder inside the SDRAM core 104, a delay time t(dec) is further generated. As a result, there is a total delay time (t(control)+t(dec)) between the generation of the signals synchronized with the rising edge of the internal clock signal 107 and the generation of the Bank Activate (ACT) command 114, the Precharge (CRC) command 115, the Write command 116, the Read command 117, and the Refresh (REF) command 118.

Therefore, in order to enable the SDRAM core 104 to recognize the commands correctly, the period t(clock) of the internal clock signal 107 must satisfy the following relation:

$$t(clock) > t(control) + t(dec) + t(set\text{-}up) \qquad (1)$$

(where t(set-up) denotes a set-up time.)

In recent years, however, the operating frequency of SDRAMs has been increased to around 160 MHz, which corresponds to a period t(clock) of about 6 ns. In order to preserve a sufficient set-up time t (set-up) and to implement a stable operation, it is therefore necessary to minimize the total delay time (t(control)+t(dec)).

FIG. 14 is a block diagram showing a second example of a typical conventional semiconductor integrated circuit device comprising an SDRAM core and a logic circuit which are integrated in a single chip. In a semiconductor integrated circuit device comprising a memory core of mainly an SDRAM and a logic circuit device integrated in a single chip, a circuit configuration is generally adopted which allows the memory core to be tested through external pins as a stand-alone unit.

The semiconductor integrated circuit device shown in FIG. 14 is different from that shown in FIG. 12 in that the former external test pins normally including a normal/test switch pin 119, a test RAS pin 120, a test CAS pin 121, a test WE pin 122, test address pins 123, test data input pins 124, and test data output pins 125.

A normal/test switch signal 126, a test RAS signal 127, a test CAS signal 128, a test WE signal 129, a test address signal 130, a test data input signal 131 and a test data output signal 132 are supplied to the normal/test switch pin 119, the test /RAS pin 120, the test /CAS pin 121, the test /WE pin 122, the test address pins 123, the test data input pins 124, and the test data output pins 113 respectively.

The /RAS signal 108, the /CAS signal 109, the /WE signal 110, an address 111, and a data input 112 are supplied to the SDRAM core 104 by way of a two-to-one selector to which the normal/test switch signal 126 is fed as a select signal. In detail, the two-to-one selector selects either a normal RAS signal 132, a normal CAS signal 133, a normal WE signal 134, a normal address signal 135, and a normal data input 136 supplied by the SDRAM controller 103 or the test RAS signal 127, the test CAS signal 128, the test WE signal 129, the test address signal 130, and the test data input signal 131 received from the test RAS pin 120, the test CAS pin 121, the test WE pin 122, the test address pins 123, and the test data input pins 124, respectively, in accordance with the normal/test switch signal 126 supplied from the normal/test switch pin 119. In a normal operation, the signals supplied by the SDRAM controller 103 are selected. When testing the memory core as a stand-alone unit, on the other hand, the test signals supplied from the external test pins are selected.

FIGS. 15(A)–15(Q) comprise a timing chart showing the operation of the second typical conventional semiconductor integrated circuit device shown in FIG. 14 in a normal operation. The operation of this conventional semiconductor integrated circuit device is different from the operation shown in FIGS. 13(A)–13(K) in that, in a normal operation, a delay time t(sel) caused by the two-to-one selector is further generated. Therefore, in order to enable the SDRAM core 104 to recognize the commands correctly, the period t(clock) of the internal clock signal 107 must satisfy the following relation:

$$t(clock) > t(control) + t(sel) + t(dec) + t(set\text{-}up) \qquad (2)$$

It is obvious from the above relation that the timing condition for the second typical conventional semiconductor integrated circuit device is more severe than for the circuit shown in FIG. 12. Thus, the conventional SDRAMs described above have some problems, as follows.

(a) In the first place, the conventional SDRAMs can not keep up with operations at higher operating frequencies at which SDRAMs produced in recent years operate. The delay time of the decoder circuit described above is about 1 ns. At an operating frequency of about 160 MHz, the clock period is about 6 ns. As a result, the delay time of the decoder circuit is a hindrance to an effort to increase the operating frequency of the SDRAM.

(b) In the second place, an input buffer for signals generated in the logic circuit as well as an SDRAM test circuit and a selector which are not naturally used in a normal operation but required for testing are provided, causing delay in the propagation of the RAS, CAS, and WE signals and others and resulting in differences in delay times among these signals. The delay time and the differences in delay times are also a hindrance to speed improvement and stable operation of the SDRAM.

SUMMARY OF THE INVENTION

The present invention addresses the problems described above. It is thus an object of the present invention to provide a semiconductor integrated circuit device which comprises an SDRAM and a logic circuit integrated in a single chip, using existing SDRAM technology as a base, that can be accessed at a high speed. It is another object of the present invention to further provide a method for testing such a semiconductor integrated circuit device easily.

According to one aspect of the present invention, a semiconductor integrated circuit device comprises a logic circuit and a synchronous dynamic random access memory including a core unit, and the logic circuit and the synchronous dynamic random access memory are integrated into a single semiconductor chip. The device comprises a synchronous dynamic random access memory control circuit receiving external control signals for the synchronous dynamic random access memory from the logic circuit, and outputs signals to the core unit of the synchronous dynamic random access memory. The output signals from the synchronous dynamic random access memory control circuit are internal control signals for controlling the core unit of the synchronous dynamic random access memory.

In another aspect of the present invention, the semiconductor integrated circuit device further comprises external input terminals for receiving and outputting internal control signals for the synchronous dynamic random access memory. A selector is provided for supplying internal control signals to the core unit of the synchronous dynamic random access memory. The internal control signals are obtained by selecting either first signals received from the external test input terminals or second signals received from the synchronous dynamic random access memory control circuit. The selector has a first mode for selecting the first signals received from the external test terminals, testing the semiconductor integrated circuit device directly, using the first signals. Further, the selector has a second mode for selecting second signals received from the synchronous dynamic random access memory control circuit.

In another aspect of the present invention, the semiconductor integrated circuit device further comprises external input terminal means for receiving and outputting internal control signals for the synchronous dynamic random access memory. A synchronizing means is provided for receiving the internal control signals from the external input terminal means and outputting internal control signals synchronized with clock signals. A select means is provided for supplying internal control signals to the core unit of the synchronous dynamic random access memory. The internal control signals are obtained by selecting either first signals received from the synchronizing means or second signals received from the synchronous dynamic random access memory control circuit. Further, the select means has a first mode for selecting the first signals received from the synchronizing means and a second mode for selecting the second signals received from the synchronous dynamic random access memory control circuit.

In another aspect of the present invention, the semiconductor integrated circuit device further comprises external input terminal means for receiving and outputting external control signals for the synchronous dynamic random access memory. A command decoder is provided for decoding the external control signals received from the external input terminal means into internal control signals for controlling the core unit of the synchronous dynamic random access memory. A select means is provided for supplying internal control signals to the core unit of the synchronous dynamic random access memory. The internal control signals are obtained by selecting either first signals received from the command decoder or second signals received from the synchronous dynamic random access memory control circuit. Further, the select means has a first mode for selecting the first signals received from the command decoder and a second mode for selecting the second signals received from the synchronous dynamic random access memory control circuit.

In another aspect of the present invention, the semiconductor integrated circuit device further comprises external input terminal means for receiving and outputting external control signals for the synchronous dynamic random access memory. A synchronizing means is provided for receiving the external control signals from the external input terminal means and outputting external control signals synchronized with clock signals. A command decoder for decoding the external control signals received from the synchronizing means into internal control signals for controlling the core unit of the synchronous dynamic random access memory. A select means is provided for supplying internal control signals to the core unit of the synchronous dynamic random access memory. The internal control signals are obtained by selecting either first signals received from the command decoder or second signals received from the synchronous dynamic random access memory control circuit.

Further, the select means has a first mode for selecting the first signals received from the command decoder and a second mode for selecting the second signals received from the synchronous dynamic random access memory control circuit.

In another aspect of the present invention, the semiconductor integrated circuit device further comprises external input terminal means for receiving and outputting external control signals for the synchronous dynamic random access memory. A command decoder is provided for decoding the external control signals received from the external input terminal means into internal control signals for controlling the core unit of the synchronous dynamic random access memory. A synchronizing means is provided for receiving the internal control signals from the command decoder and outputting internal control signals synchronized with clock signals. A select means is provided for supplying internal control signals to the core unit of the synchronous dynamic random access memory the internal control signals being obtained by selecting either first signals received from the synchronizing means or second signals received from the synchronous dynamic random access memory control circuit. Further, the select means has a first mode for selecting the first signals received from the synchronizing means and a second mode for selecting the second signals received from the synchronous dynamic random access memory control circuit.

Other features and advantages of the invention will be apparent from the following description taken in connection with the accompanying drawings.

DETAILED DESCRIPTION OF PREFERRED EMBODIMENTS

Figure 1:
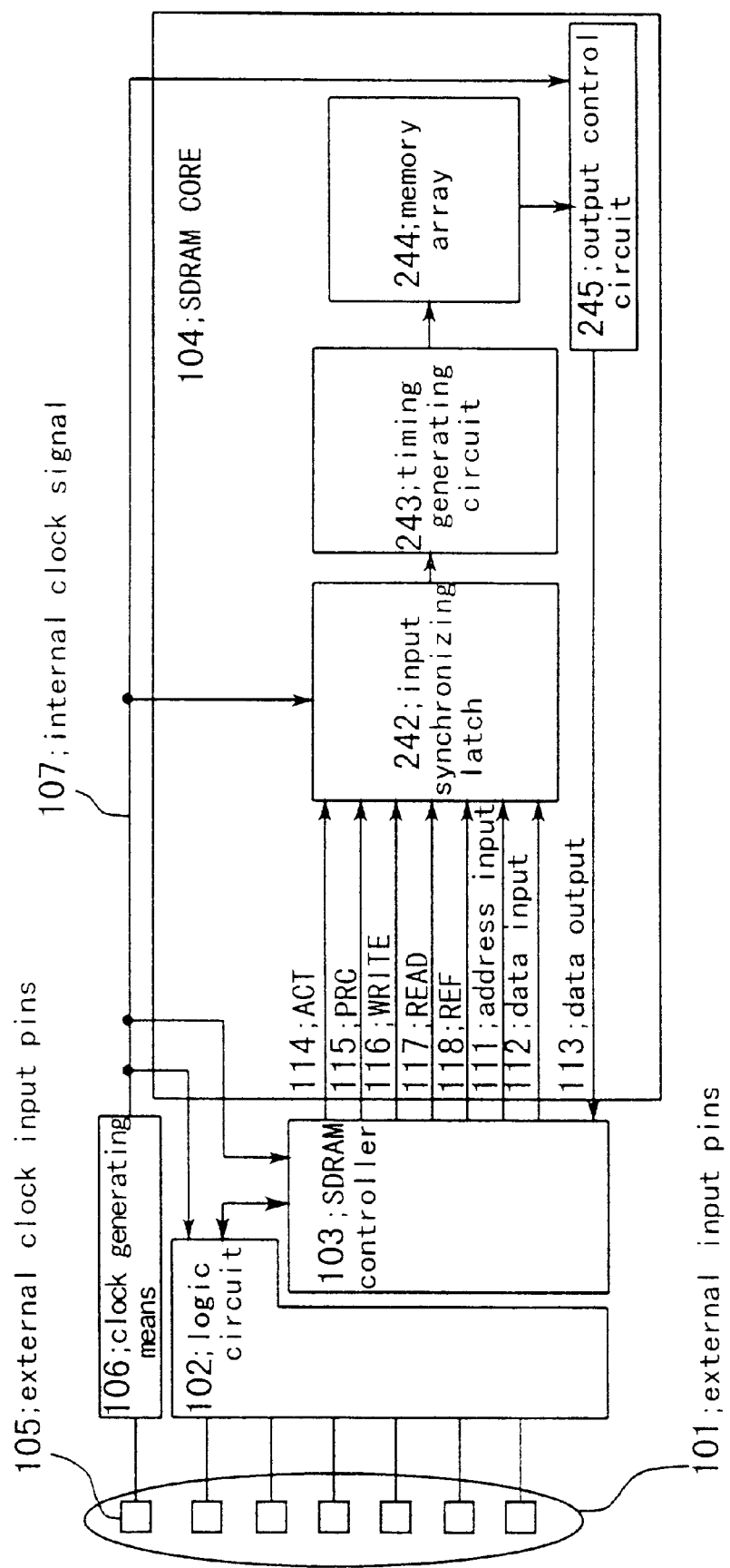
FIG. 1 is a block diagram showing a semiconductor integrated circuit device comprising an SDRAM core and a semiconductor logic circuit device which are integrated as in a single chip according to a first embodiment of the present invention.

The present invention will become more apparent from the following detailed description with reference to the figures, in which same reference numerals denote the same or corresponding parts.

First Embodiment

Figure 2:
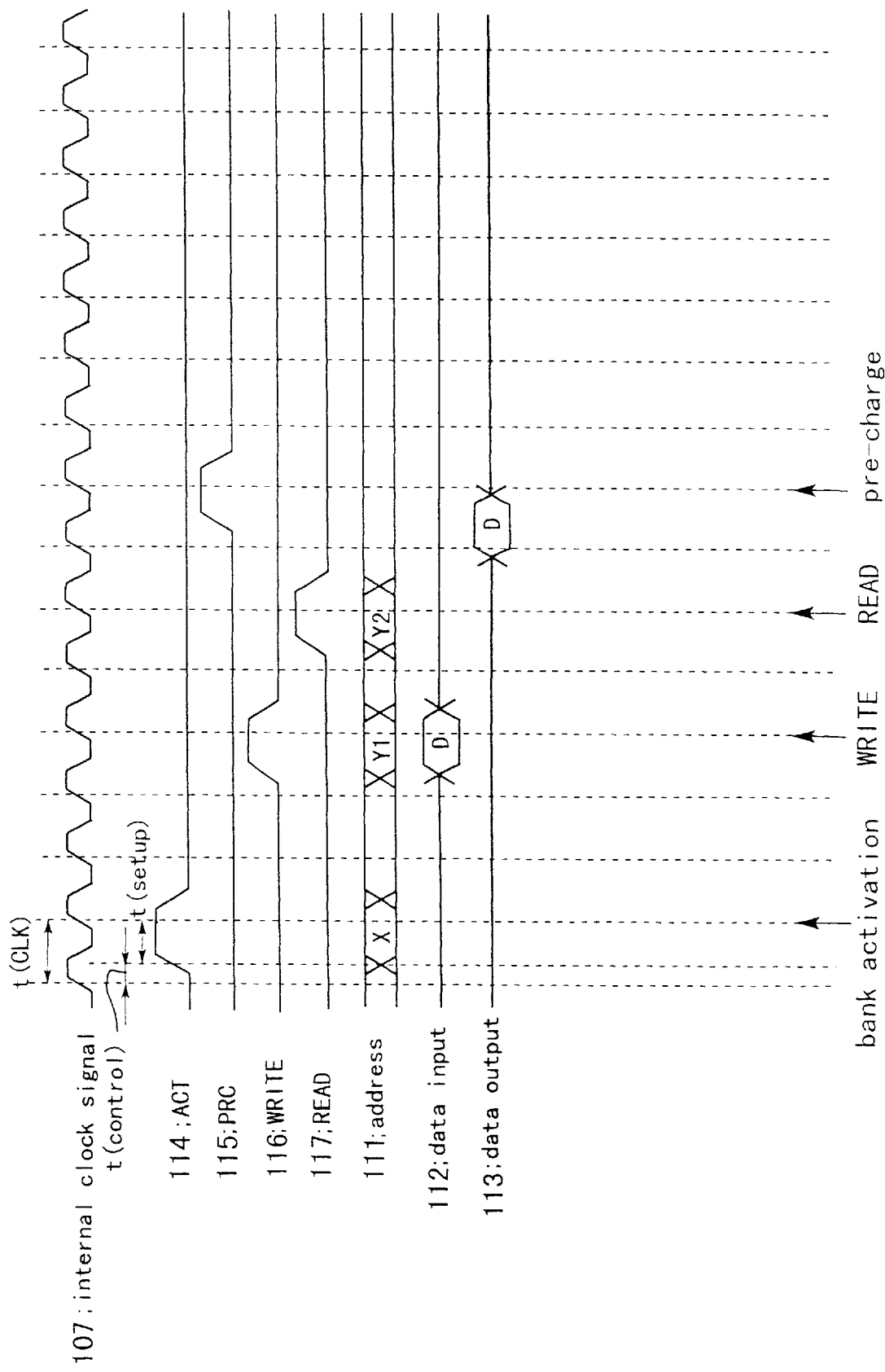
FIG. 2 comprise a timing chart showing the operation of the semiconductor integrated circuit device provided by the first embodiment of the present invention as shown in FIG. 1.

A first embodiment of the present invention is explained by referring to FIGS. 1 and 2.

FIG. 1 is a block diagram showing a semiconductor integrated circuit device comprising an SDRAM core and a semiconductor logic circuit device integrated in a single chip according to a first embodiment of the present invention.

Reference numerals 101 and 102 are external pins and a logic circuit, respectively. Reference numeral 103 denotes an SDRAM controller and reference numeral 104 is an SDRAM core. Reference numerals 105 and 106 denote an external clock input pin and a clock generating means respectively. Reference numeral 107 is an internal clock signal generated by the clock generating means 106 and reference numeral 114 denotes an ACT signal. Reference numerals 115 and 116 are a PRC signal and a Write signal respectively. Reference numeral 117 denotes a Read signal and reference numeral 118 is a REF signal. Reference numerals 111 and 112 denote an address input signal and a data input signal, respectively. Reference numeral 113 is a data output signal output by the SDRAM core 104 and reference numeral 244 denotes a memory array. Reference numeral 242 is an input synchronizing latch for latching signals supplied to the SDRAM core 104, and reference numeral 243 denotes a timing generating circuit for generating internal operation signals to be supplied to the memory array 244. Finally, reference numeral 245 is an output control circuit for synchronizing an output of the memory array 244 with the clock signal 107 and supplying the output to the SDRAM controller 103.

Figure 12:
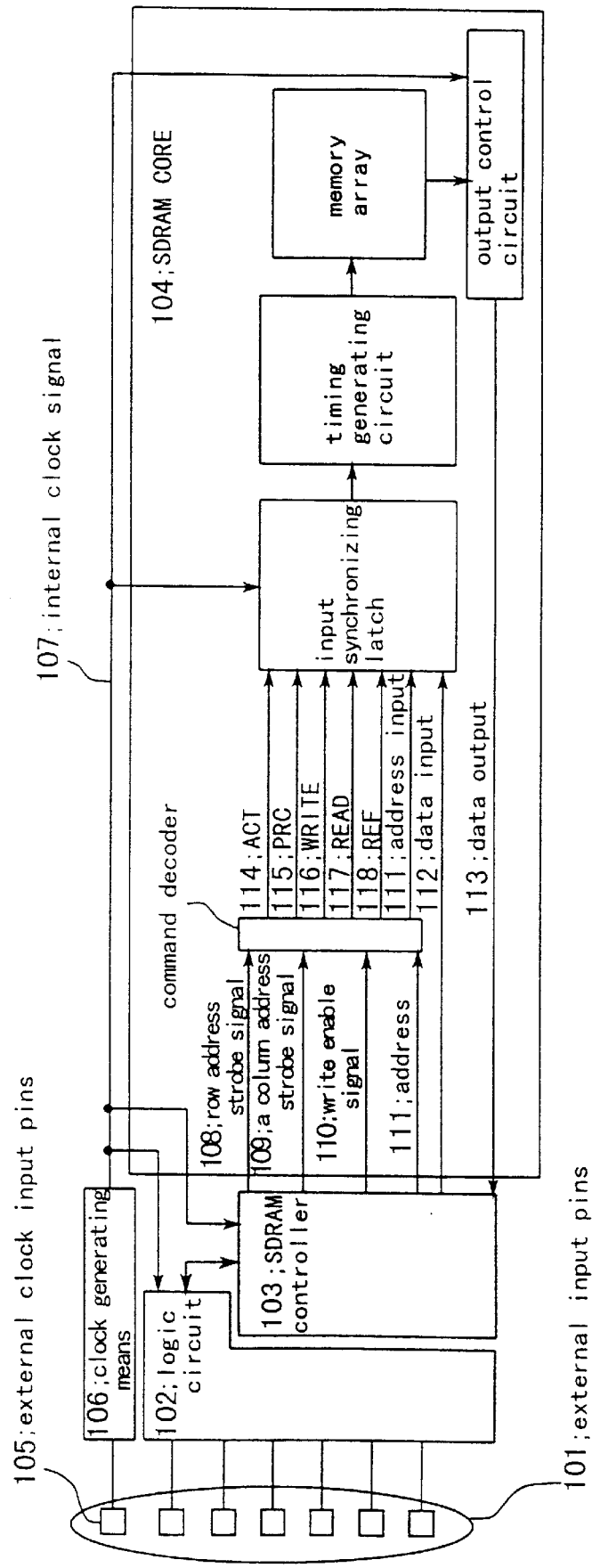
FIG. 12 is a block diagram of a first example of a typical conventional semiconductor integrated circuit device comprising an SDRAM core and a logic circuit integrated in a single chip.
Figure 13:
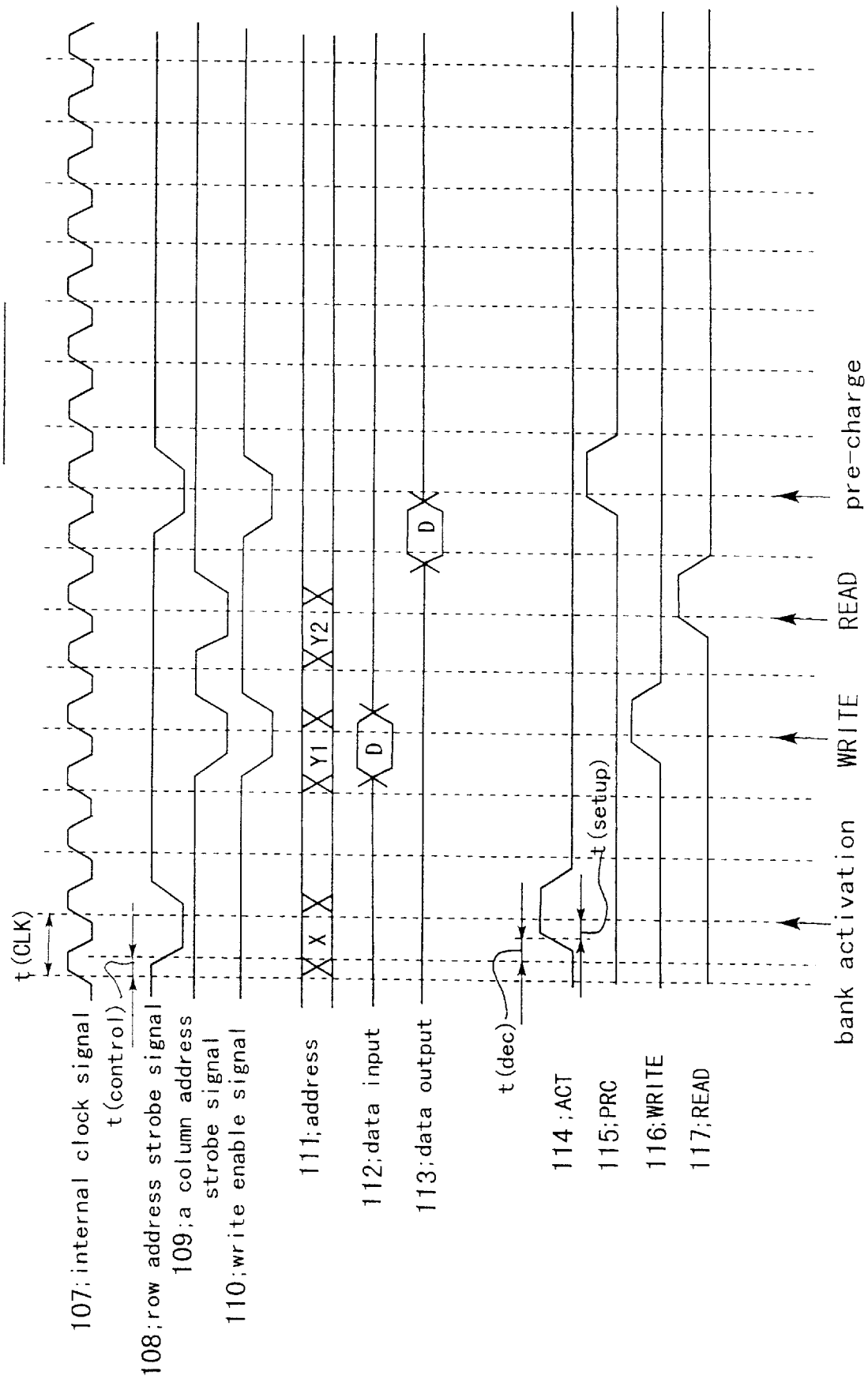
FIG. 13 comprise a timing chart showing the operation of the first typical conventional semiconductor integrated circuit device shown in FIG. 12.

Signals input by way of the external pins 101 are supplied to the memory array 244 through the logic circuit 102, the SDRAM controller 103, the input synchronizing latch 242 and the timing generating circuit 243 in which the signals undergo a variety of conversion processes. The semiconductor integrated circuit device provided by the present invention is different from the conventional device shown in FIG. 12 in that the former is improved over the latter as evidenced by the fact that the output signals of the SDRAM controller 103 are not external control signals such as /RAS 108, /CAS 109 and /WE 110 for accessing the general-purpose SDRAM, but are internal control signals such as ACT 114, PRC 115, Write 116, Read 117 and REF 118. As a result, the delay time caused by the conventional command decoder employed in the conventional SDRAM core is eliminated.

FIGS. 2(A)–2(H) comprise a timing chart showing the operation of the semiconductor integrated circuit device provided by the first embodiment of the present invention as shown in FIG. 1. The internal control signals ACT 114, PRC 115, Write 116, Read 117 and REF 118 are generated in the SDRAM controller 103, synchronized with the rising edge of the internal clock signal 107, appearing after the delay time t(control) has lapsed, following the rising edge of the internal clock signal 107.

Since the internal control signals ACT 114, PRC 115, Write 116, Read 117, and REF 118 are latched directly in the input synchronizing latch 242 inside the SDRAM core 104, the period t(CLK) of the internal clock signal 107 must now merely satisfy the following relation:

$$t(CLK) > t(control) + t(set\text{-}up) \quad (3)$$

Comparison of the relation (3) with the relation (1) indicates that it is possible to implement a high-speed interface with the SDRAM CORE 104.

As described above, according to the semiconductor integrated circuit device provided by the first embodiment, the delay time caused by the command decoder employed in the SDRAM core can be eliminated, providing a semiconductor integrated circuit device having stable operation at high speed.

Second Embodiment.

Figure 3:
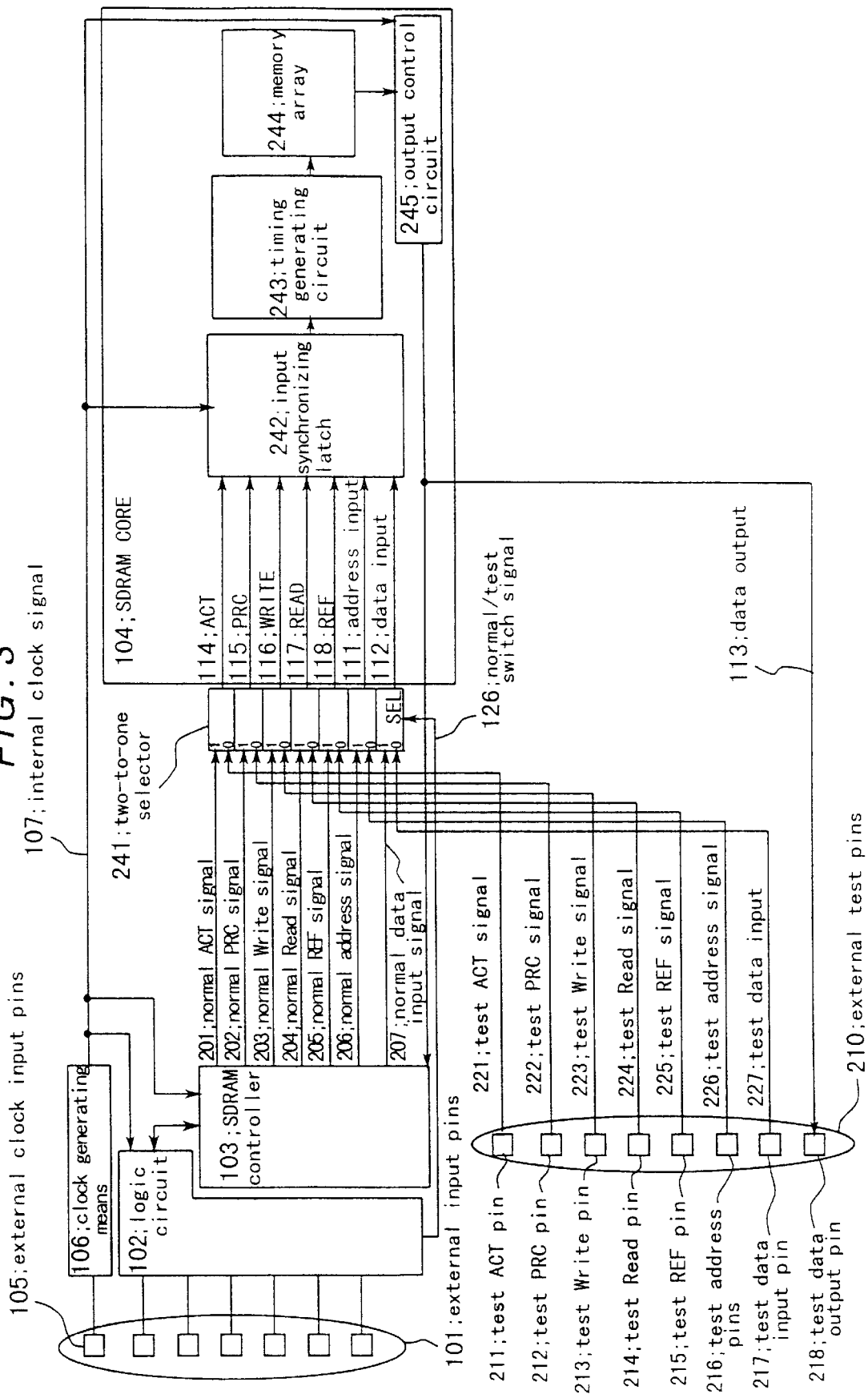
FIG. 3 is a block diagram showing a semiconductor integrated circuit device according to a second embodiment of the present invention.
Figure 4:
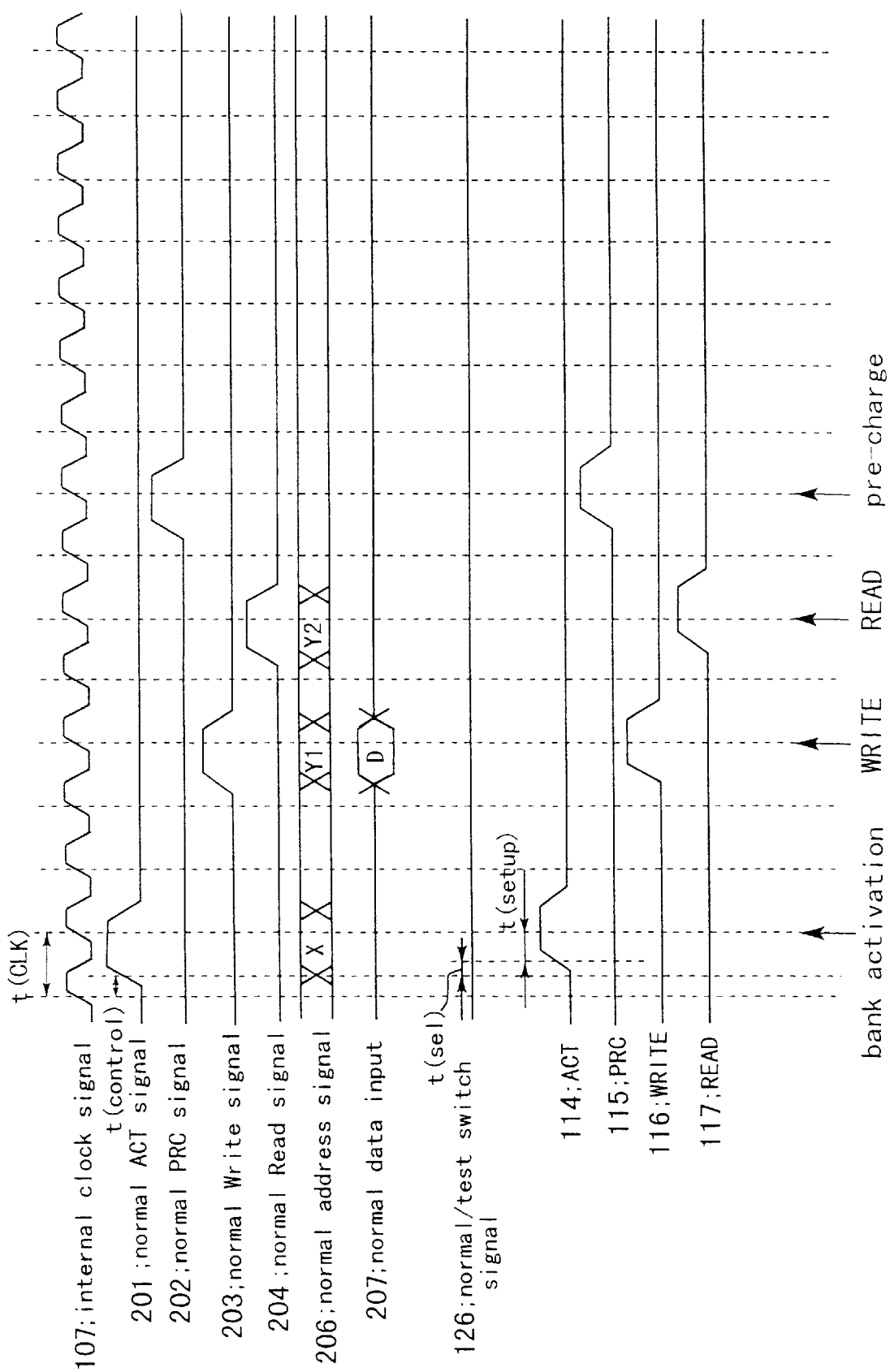
FIG. 4 comprise is a timing chart showing the operation of the semiconductor integrated circuit device of FIG. 3.

A second embodiment of the present invention is described by referring to FIGS. 3 and 4.

FIG. 3 is a block diagram showing a semiconductor integrated circuit device according to a second embodiment of the present invention. Reference numeral 210 shown in the figure designates external test pins which include a test ACT pin 211, a test PRC pin 212, a test Write pin 213, a test Read pin 214, a test REF pin 215, test address pin 216, a test data input pin 217, and a test data output pin 218. The external test pins 210 receive test signals. Reference numeral 241 is a two-to-one selector for selecting one of two groups of input signals as its output signals in accordance with a control signal. One of the two groups of inputs are control signals output by the SDRAM controller 103 while the other groups of inputs are the test signals supplied from the external test pins 210. The control signal used by the two-to-one selector 241 is a signal that can be output by the logic circuit 102. The rest of the configuration is the same as the first embodiment.

Figure 14:
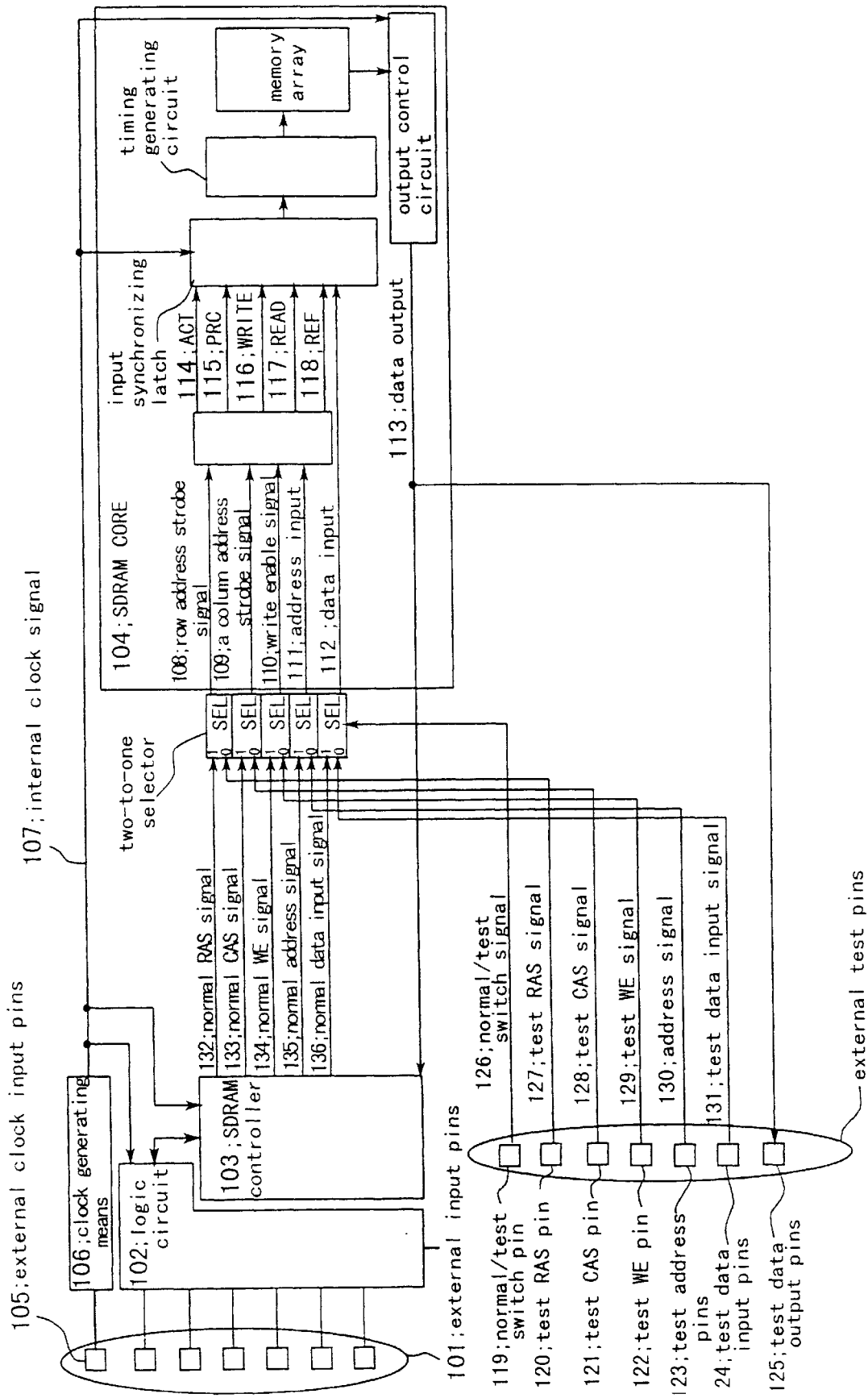
FIG. 14 is a block diagram showing a second example of a typical conventional semiconductor integrated circuit device comprising an SDRAM core and a logic circuit which integrated in a single chip.
Figure 15:
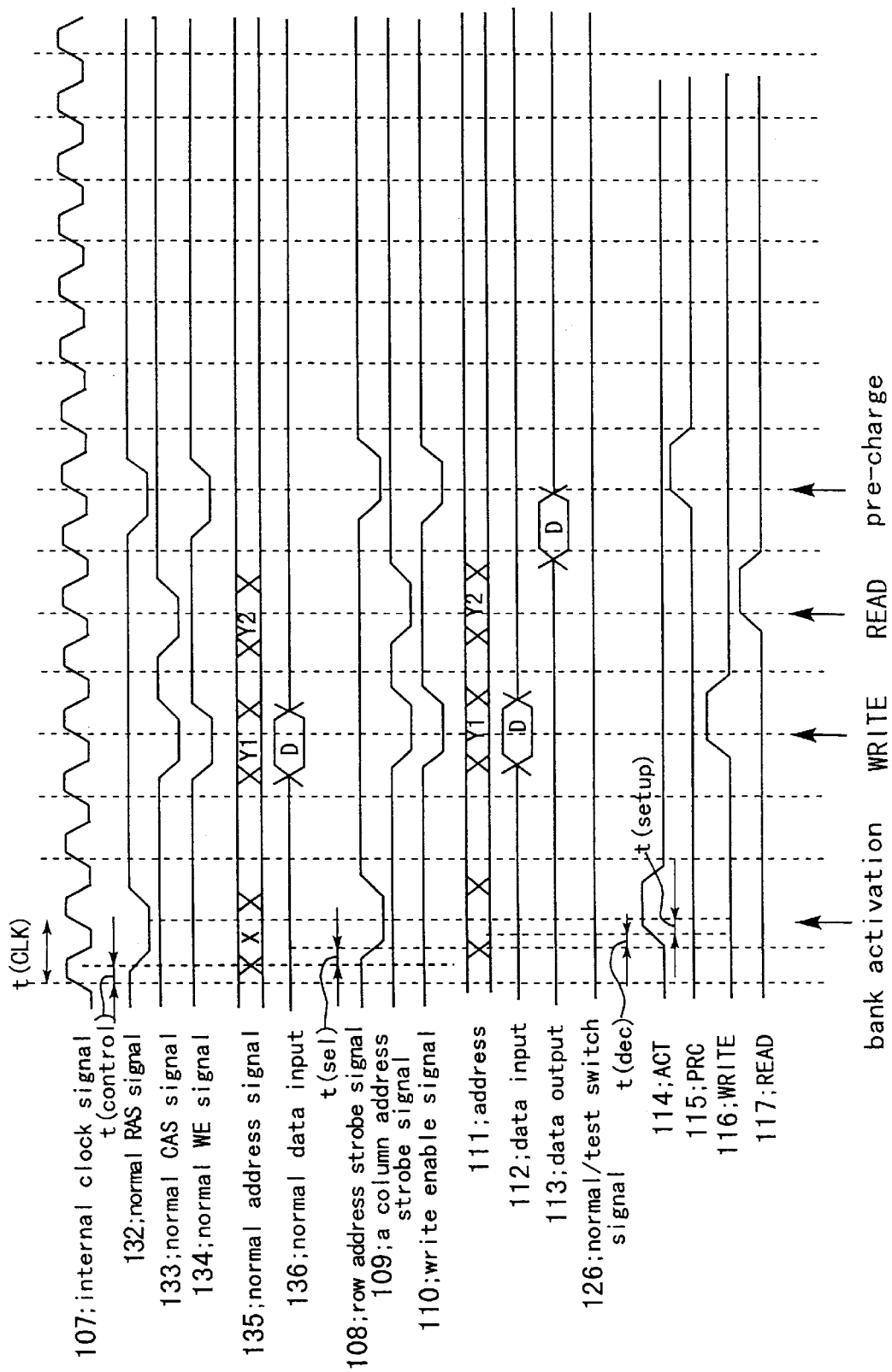
FIG. 15 (A)–(Q) comprise a timing chart showing the operation of the second typical conventional semiconductor integrated circuit device shown in FIG. 14 in a normal operation.

The second embodiment is different from the conventional semiconductor integrated circuit device shown in FIG. 14 in that the outputs of the general-purpose SDRAM controller 103 are not the external control signals, i.e., a normal CAS signal 132, a normal RAS signal 133, and a normal WE signal 134, but are the internal control signals, i.e., a normal ACT signal 201, a normal PRC signal 202, a normal Write signal 203, a normal Read signal 204 and a normal REF signal 205. The second embodiment is further different in that the two-to-one selector 241 is provided. The reference numeral 206 shows a normal address signal, and reference numeral 207 shows a normal data input signal. As a result, the delay time caused by the command decoder employed in the SDRAM core 104 in the conventional device is eliminated.

FIGS. 4(A)–4(L) comprise a timing chart showing the operation of the semiconductor integrated circuit device provided by the second embodiment of the present invention as shown in FIG. 3. The normal ACT signal 201, the normal PRC signal 202, the normal Write signal 203, the normal Read signal 204, and the normal REF signal 205 are generated in the SDRAM controller 103 synchronized with the rising edge of the internal clock signal 107, and appearing after the delay time t(control) has lapsed, following the rising edge of the internal clock signal 107. Since these internal control signals pass through the two-to-one selector 241, however, another delay time t(sel) is added before the internal control signals arrive at the input synchronizing latch 242 employed in the SDRAM core 104.

The input synchronizing latch 242 employed in the SDRAM core 104 receives the internal control signals directly (from the two-to-one selector 241 without the need for the signals to go through a command detector). As a result, the period t(CLK) of the internal clock signal 107 now needs only to satisfy the following relation:

$$t(CLK) > t(control) + t(sel) + t(set\text{-}up) \quad (4)$$

Comparison of the relation (4) with the relation (2) indicates that it is possible to implement a high-speed interface with the SDRAM core 104. In addition, the SDRAM core 104 can be tested as a stand-alone unit directly from the external test pins in a state that cannot exist in normal operation.

The two-to-one selector 241 selects the output of the SDRAM controller 103 or the external test signals supplied by way of the external test pins 210 when the normal/test switch signal 126 is set at an "H" level or reset at an "L" level respectively. The two-to-one selector 241 may also be designed to select one of its inputs supplied at the "H" and "L" logic, conversely to what is described above.

As described above, the external test pins 210 are separate from the external pins 101, pins dedicated for solely testing purposes. However, that the external test pins 210 can be connected to the logic circuit 102 and used in a normal operation if there is no need to use the external test pins 210 for testing. Further, other external pins not shown in the figure may also be used as external test pins.

Further, it is not necessary to output the normal/test switch signal 126 from the logic circuit. As indicated in the description of the conventional technology, the normal/test switch signal 126 can also be obtained directly from one of the external test pins.

In addition to the effects exhibited by the first embodiment described earlier, the semiconductor integrated circuit device and the test method provided by the second embodiment, achieve the following effect. The internal control signals are directly supplied to the SDRAM core from a source outside the semiconductor integrated circuit device as test signals so the SDRAM core can be tested in a wider range of timing conditions.

Third Embodiment

Figure 5:
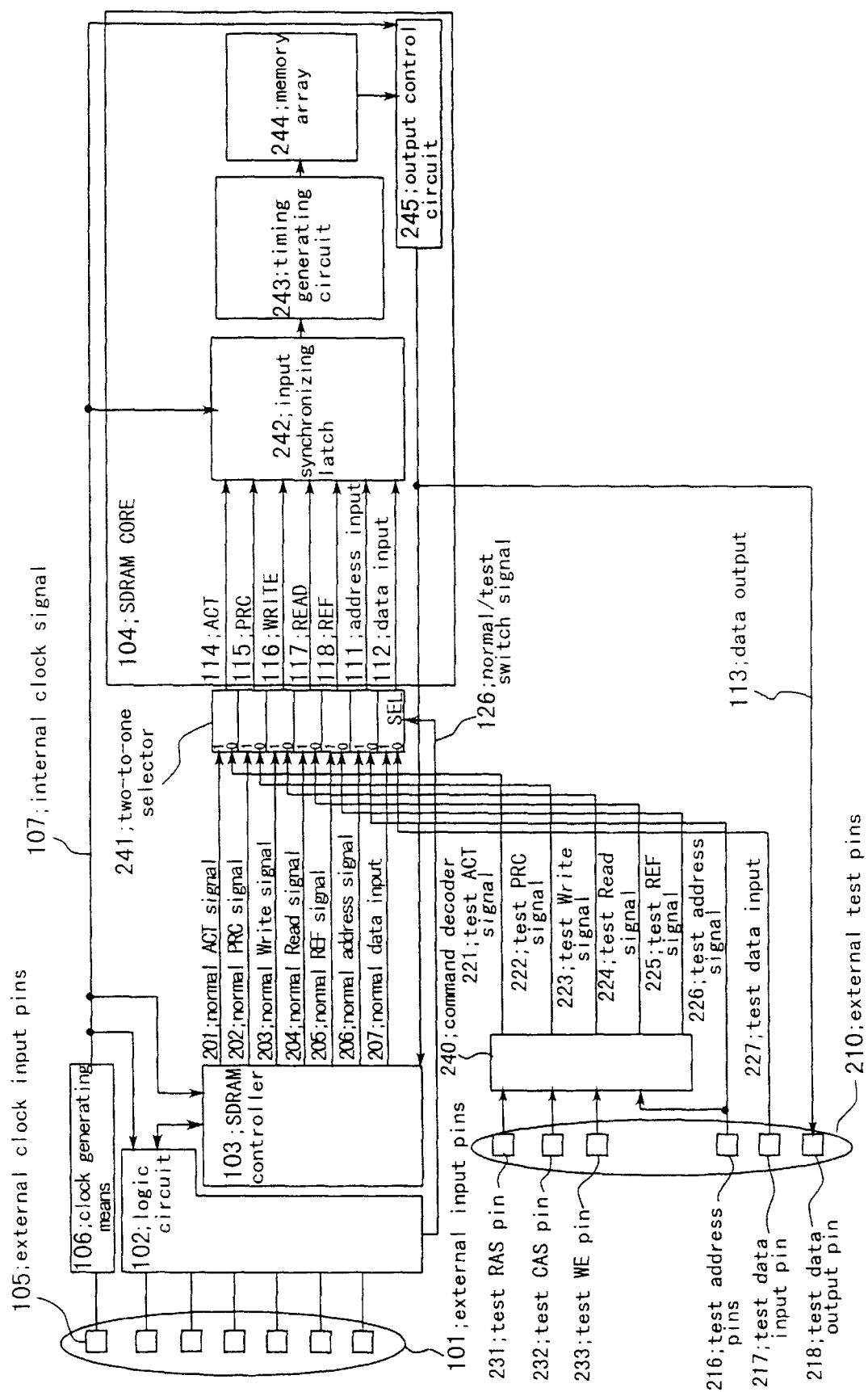
FIG. 5 is a block diagram showing a semiconductor integrated circuit device according to a third embodiment of the present invention.

Next, a third embodiment of the present invention is explained by referring to FIG. 5. FIG. 5 is a block diagram showing a semiconductor integrated circuit device according to a third embodiment of the present invention.

The third embodiment is different from the second embodiment shown in FIG. 3 in that the configuration of the external test pins 210 is modified and in that a command decoder 240 is added.

In a normal operation indicated by the normal/test switch signal 126 set at the "H" level, the output of the SDRAM controller 103 is selected. The normal operation is the same as the operation illustrated by the timing chart for the second embodiment, FIGS. 4(A)–4(L). Thus, the third embodiment provides a high-speed interface with the SDRAM core 104 in normal operation as is the case with the second embodiment shown in FIG. 3.

As shown in FIG. 5, in the third embodiment, the external test pins 210 comprise a test RAS pin 231, a test CAS pin 232, and a test WE pin 233. In addition, the command decoder 240 is provided to decode external control signals, supplied through the external test pins, into internal control signals.

As a result, the same interface as a general-purpose stand-alone SDRAM can be brought to such external pins.

In such a configuration, the testing environment of the SDRAM core 104 as a stand-alone unit can be shared with the general-purpose stand-alone SDRAM, for example, the test equipment and the test program can be shared. In addition, the SDRAM core 104 can be tested directly from the external pins.

Fourth Embodiment

Figure 6:
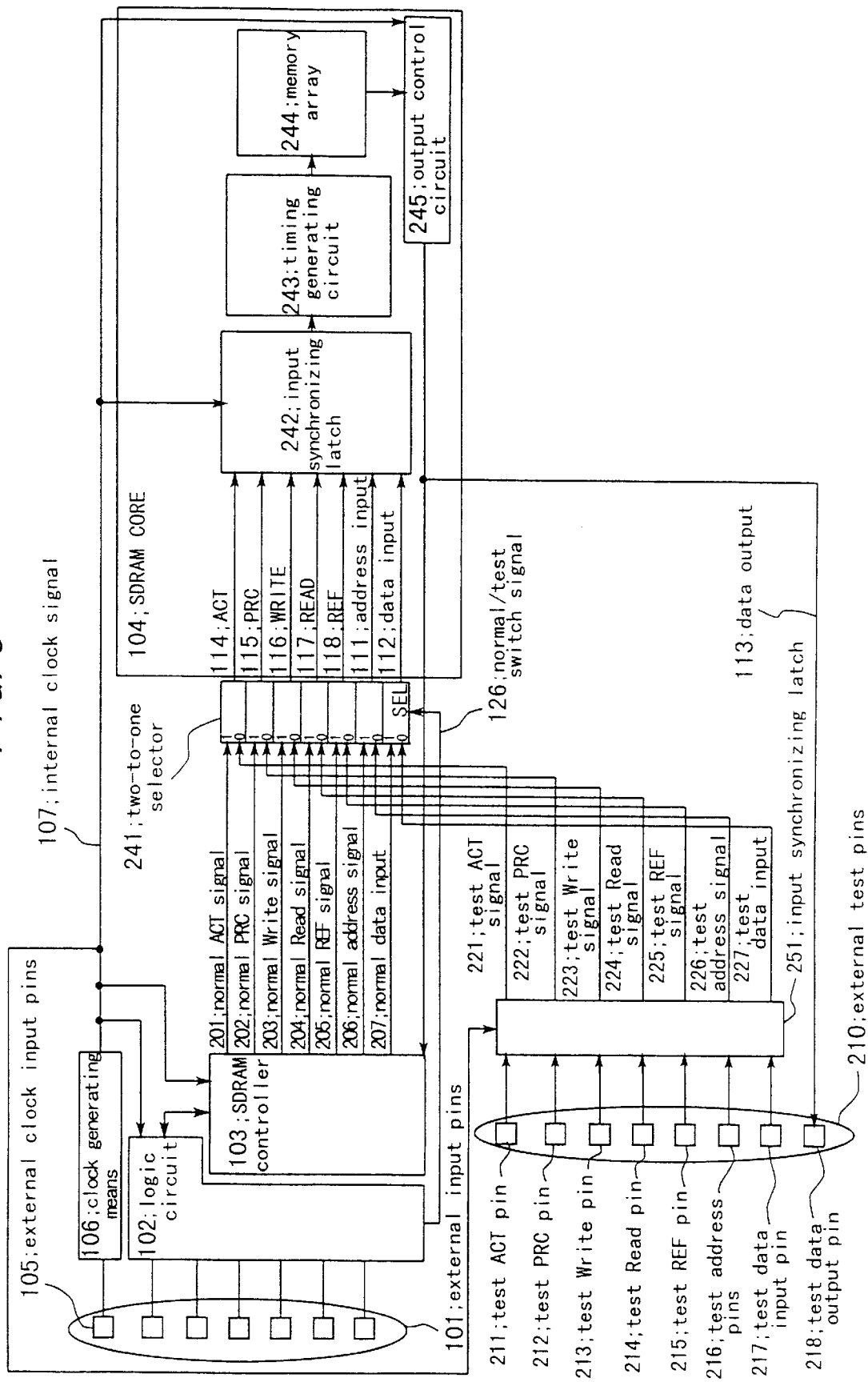
FIG. 6 is a block diagram showing a semiconductor integrated circuit device according to a fourth embodiment of the present invention.
Figure 7:
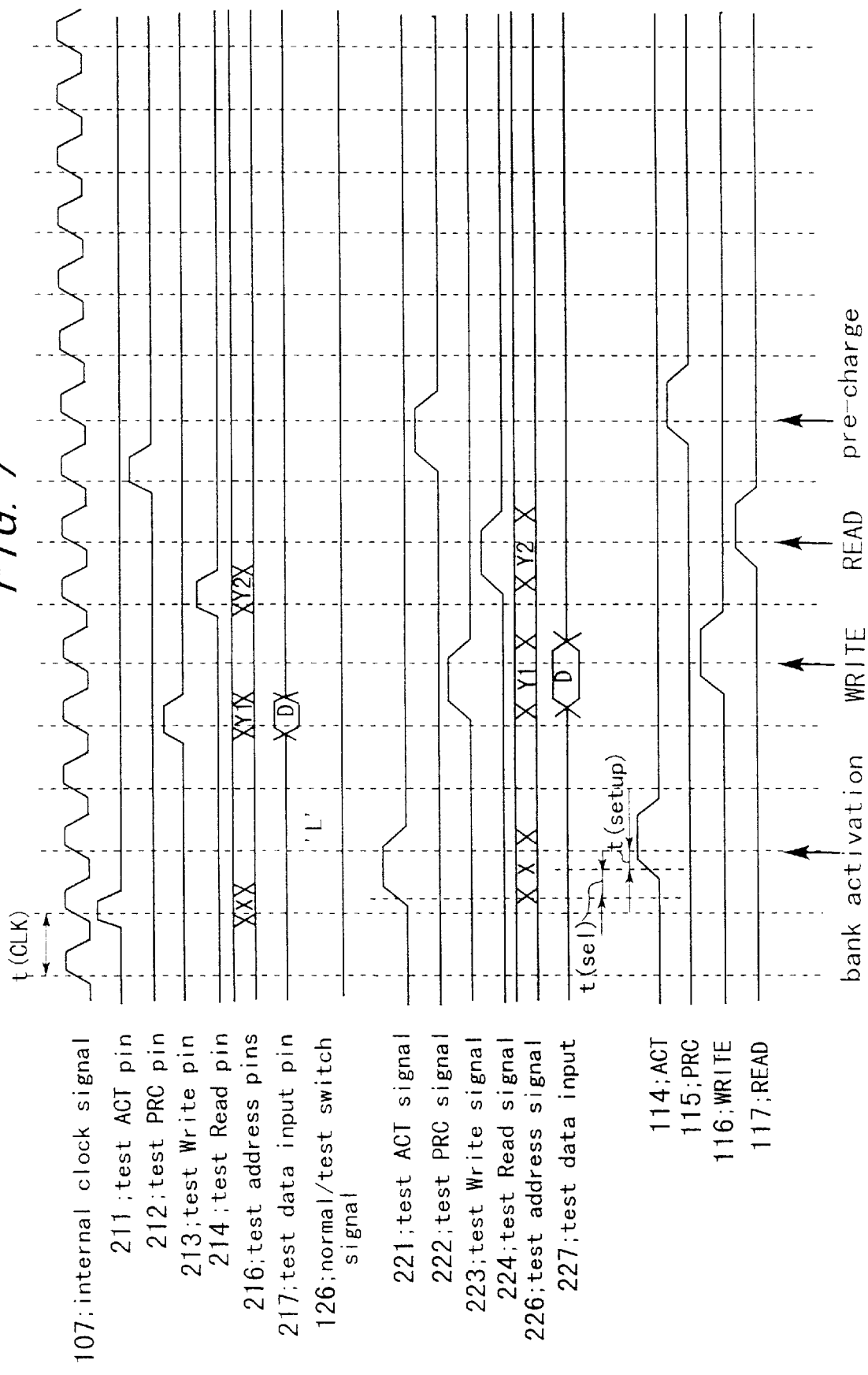
FIG. 7 comprise a timing chart showing the operation of the semiconductor integrated circuit device provided by FIG. 6.

Next, a fourth embodiment of the present invention is explained by referring to FIGS. 6 and 7.

FIG. 6 is a block diagram showing a semiconductor integrated circuit device according to a fourth embodiment of the present invention. In comparison with the second embodiment shown in FIG. 3, the fourth embodiment is provided with an input synchronizing latch 251. Internal control signals supplied through a test ACT pin 211, a test PRC pin 212, a test Write pin 213, a test Read pin 214, a test REF pin 215, a test address pin 216, and a test data input pin 217 of the external test pins 210 are latched into the input synchronizing latch 251 for synchronization with the internal clock signal 107.

FIGS. 7(A)–7(R) comprise a timing chart showing the operation of the semiconductor integrated circuit device according to the fourth embodiment of present invention shown in FIG. 6.

In comparison with the second and third embodiments explained so far, the fourth embodiment is effective when the pulse widths of test signals supplied to the external test pins 210 from equipment, such as a tester, are narrower than the period t(CLK) of the internal clock signal 107. In detail, test signals having respective pulse widths narrower than the "H" pulse of the internal clock signal 107 are supplied to the test ACT pin 211, the test PRC pin 212, the test Write pin 213, the test Read pin 214, the test REF pin 215, the test address pins 216, and the test data input pins 217. By latching the test signals in the input synchronizing latch 251 in synchronization with the internal clock signal 107, however, it is possible to generate a test ACT signal 221, a test PRC signal 222, a test Write signal 223, a test Read signal 224, a test REF signal 225, a test address signal 226, and a test data input signal 227 having respective pulse widths about equal to the period t(CLK) of the internal clock signal 107.

As a result, in the configuration of the fourth embodiment, even if the pulse widths of test signals supplied to the external test pins 210 from equipment such as a tester are shorter than the period t(CLK) of the internal clock signal 107, the test signals input from the external test pins 210 are immediately latched into the input synchronizing latch 251 and converted into test signals having longer pulse width, allowing a stable SDRAM stand-alone test to be conducted. Thereafter, the test signals are supplied to the input synchronizing latch 242 in the SDRAM core 104 by way of the two-to-one selector 241. In such a configuration, since there is no any effect on signal paths in normal operation, high-speed operation of an interface with the SDRAM core 104 is not lost.

Since a test signal from an external test pin is synchronized with the internal clock signal 107 when the test signal is input, the operation of the SDRAM core 104 is delayed by one period t(CLK) of the internal clock signal 107. By writing a test program for the test equipment to generate a test signal t(CLK), of the internal clock signal 107 one period, earlier, however, the test can be conducted without any delay.

As described above, the semiconductor integrated circuit device and the test method provided by the fourth embodiment exhibit a new effect in addition to the effects of the third embodiment. That is to say, in the case of the fourth embodiment, even if the pulse widths of test signals supplied to the external test pins 210 from equipment such as a tester are shorter than the period t(CLK) of the internal clock signal 107, the test signals input from the external test pins 210 are immediately latched into the input synchronizing latch 251 and converted into test signals having longer pulse widths, allowing a stable SDRAM stand-alone test to be conducted.

Fifth Embodiment

Figure 8:
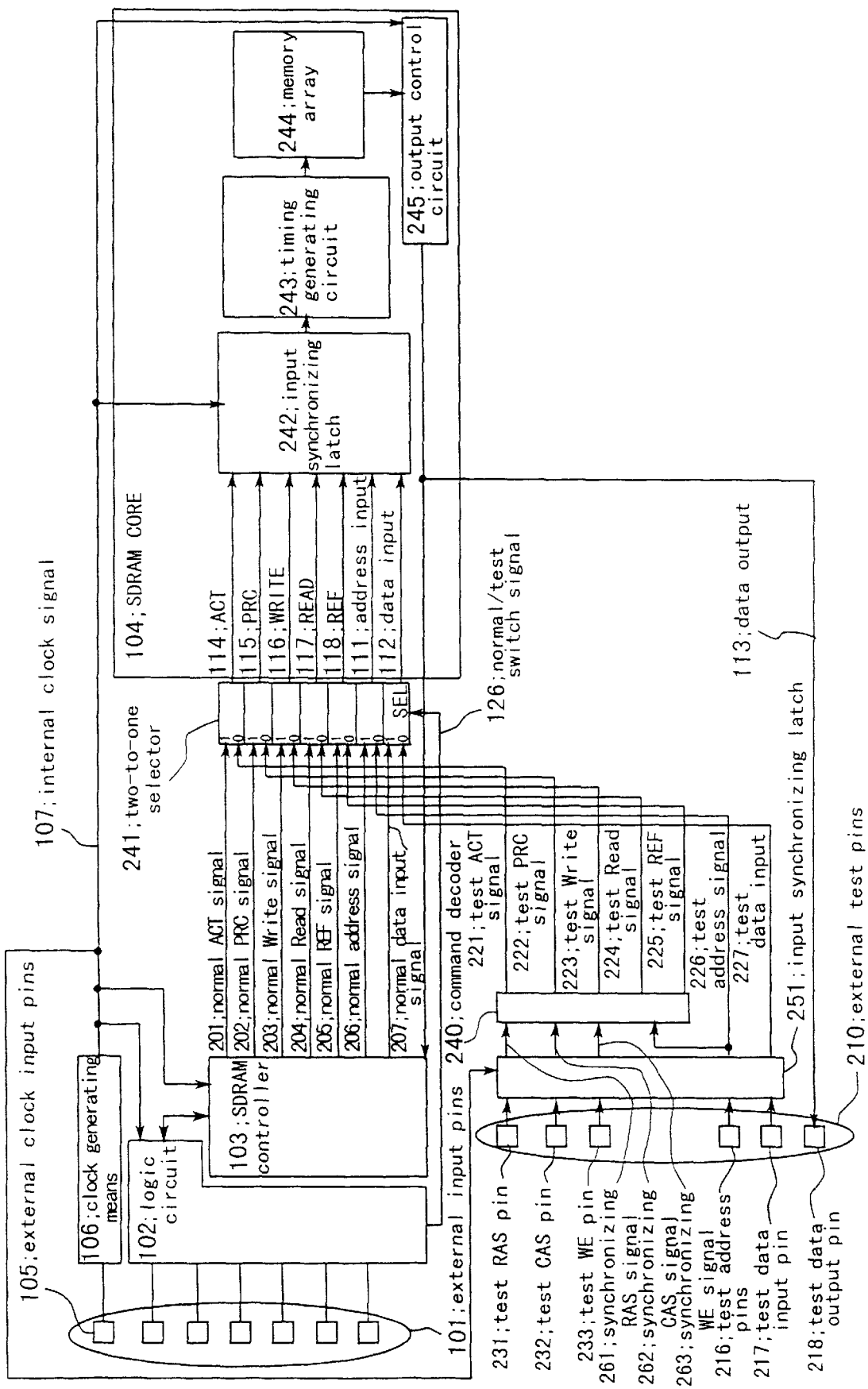
FIG. 8 is a block diagram showing a semiconductor integrated circuit device according to a fifth embodiment of the present invention.
Figure 9:
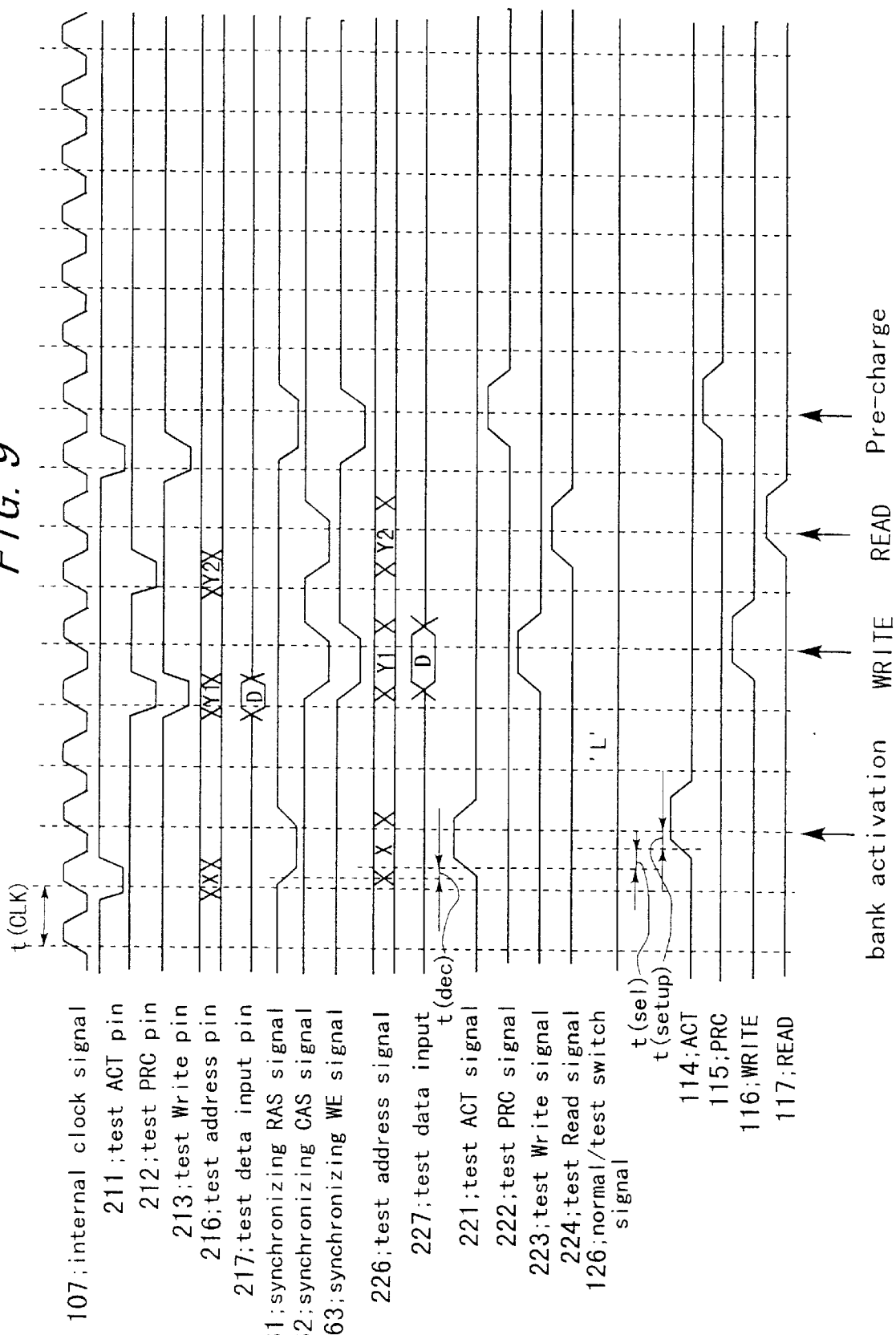
FIG. 9 comprise is a timing chart showing the operation of the semiconductor integrated circuit device of FIG. 8.

Next, a fifth embodiment of the present invention is explained by referring to FIGS. 8 and 9.

FIG. 8 is a block diagram showing a semiconductor integrated circuit device according to the fifth embodiment of the present invention. As shown in FIG. 8, the fifth embodiment is different from the third embodiment shown in FIG. 5 in that external control signals for testing supplied by way of the test RAS pin 231, the test CAS pin 232, the test WE pin 233, the test address pins 216, and the test data input pins 217 of the external test pins 210 are latched, in synchronization with the internal clock signal 107, into an input synchronizing latch 251 located in front of a command decoder 240.

FIGS. 9(A)–9(T) comprise a timing chart showing the operation of the semiconductor integrated circuit device according to the fifth embodiment of present invention shown in FIG. 8.

Much like the fourth embodiment, the fifth embodiment is effective when the pulse widths of test signals supplied to the external test pins 210 from equipment such as a tester are narrower than the period t(CLK) of the internal clock signal 107. In detail, when the test signals have respective pulse widths narrower than the "H" pulse of the internal clock signal 107 are supplied to the test RAS pin 231, the test CAS pin 232, the test WE pin 233, the test address pins 216 and the test data input pins 217. By latching the test signals in the input synchronizing latch 251 in synchronization with the internal clock signal 107, however, it is possible to generate a test RAS signal 261, a test CAS signal 262, a test WE signal 263, a test address signal 226, and a test data input signal 227 having respective pulse widths about equal to the period t(CLK) of the internal clock signal 107.

As a result, in of the fifth embodiment, even if the pulse widths of test signals supplied to the external test pins 210 from equipment such as a tester are narrower than the period t(CLK) of the internal clock signal 107, the test signals input from the external test pins 210 are immediately latched in the input synchronizing latch 251 and converted into test signals having longer pulse widths, allowing a stable SDRAM stand-alone test to be conducted.

The stable test RAS signal 261, the stable test CAS signal 262, the stable test WE signal 263, and the stable test address signal 226 are then supplied to the command decoder 240. Receiving the synchronized test signals, the command decoder 240 outputs a test ACT signal 221, a test PRC signal 222, a test Write signal 223, a test Read signal 224, a test REF signal 225, a test address signal 226, and a test data input signal 227, each having a pulse width about equal to the period t(CLK) of the internal clock signal 107. Thereafter, the test ACT signal 221, the test PRC signal 222, the test Write signal 223, the test Read signal 224, the test REF signal 225, test address signal 226, and test data input signal 227 are supplied to the input synchronizing latch 242 inside the SDRAM core 104 by way of the two-to-one selector 241.

As described above, in such a configuration, even if the pulse widths of test signals supplied to the external test pins 210 from equipment, such as a tester, are narrower than the period t(CLK) of the internal clock signal 107, the test signals input from the external test pins 210 are immediately latched in the input synchronizing latch 251 and converted into test signals having respective, longer pulse widths, allowing a stable SDRAM stand-alone test to be conducted. Since there is no effect on signal paths in normal operation, high-speed operation of an interface with the SDRAM core 104 is not lost.

Since a test signal from an external test pin is synchronized with the internal clock signal 107 when the test signals input, the operation of the SDRAM core 104 is delayed by one period t(CLK) of the internal clock signal 107. By writing a test program for the test equipment to generate a test signal one period, t(CLK), of the internal clock signal 107 earlier, however, a test can be conducted without causing any problems.

As described above, the semiconductor integrated circuit device and the test method provided by the fifth embodiment exhibit a new effect in addition to the effects explained in the description of the fourth embodiment. That is to say, in the case of the fifth embodiment, even if the pulse widths of test signals supplied to the external test pins 210 from equipment such as a tester are shorter than the period t(CLK) of the internal clock signal 107, the test signals input from the external test pins 210 are immediately latched in the input synchronizing latch 251 and converted into test signals having respective, longer pulse widths, allowing a stable SDRAM stand-alone test to be conducted.

Sixth Embodiment

Figure 10:
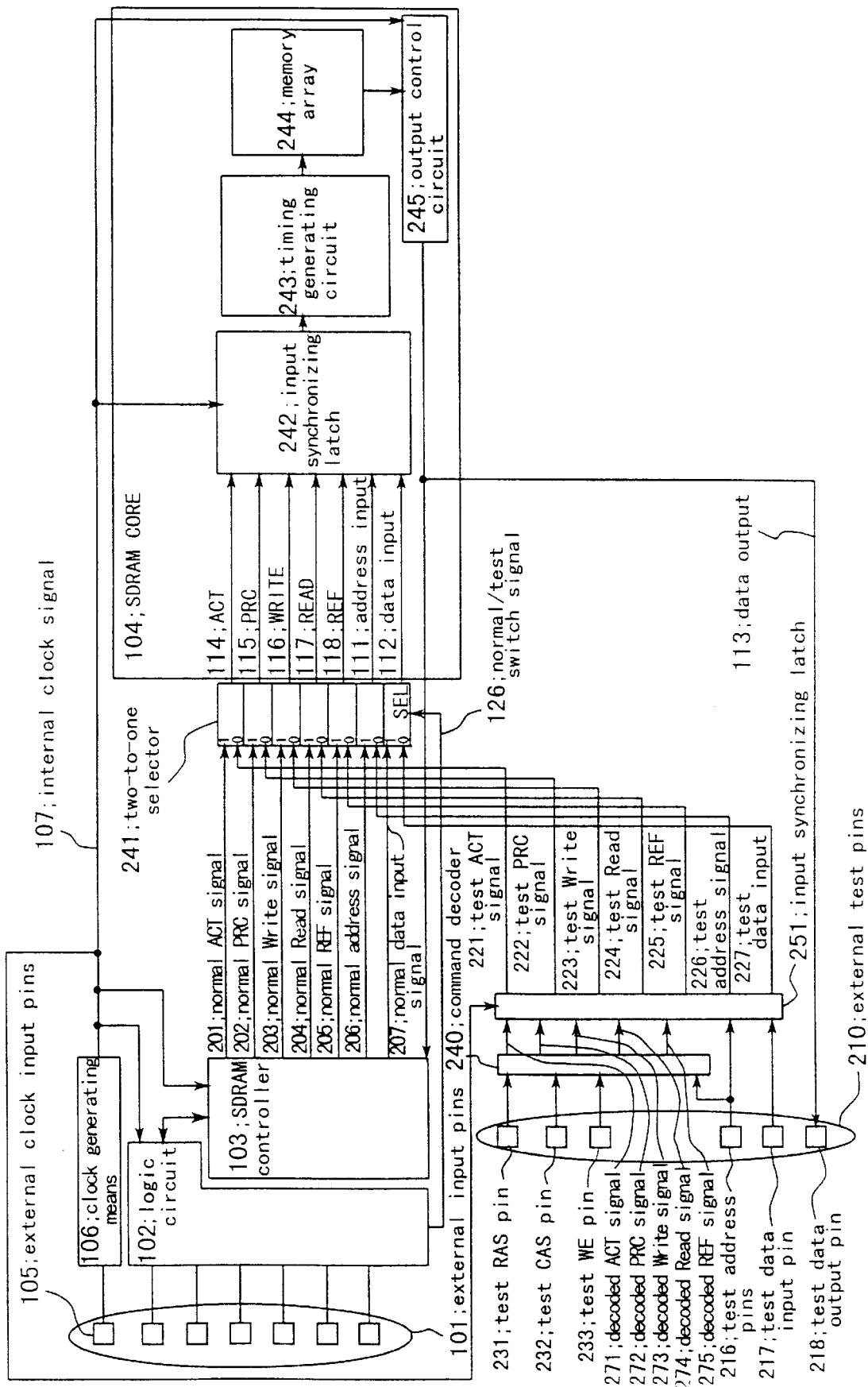
FIG. 10 is a block diagram showing a semiconductor integrated circuit device according to a sixth embodiment of the present invention.
Figure 11:
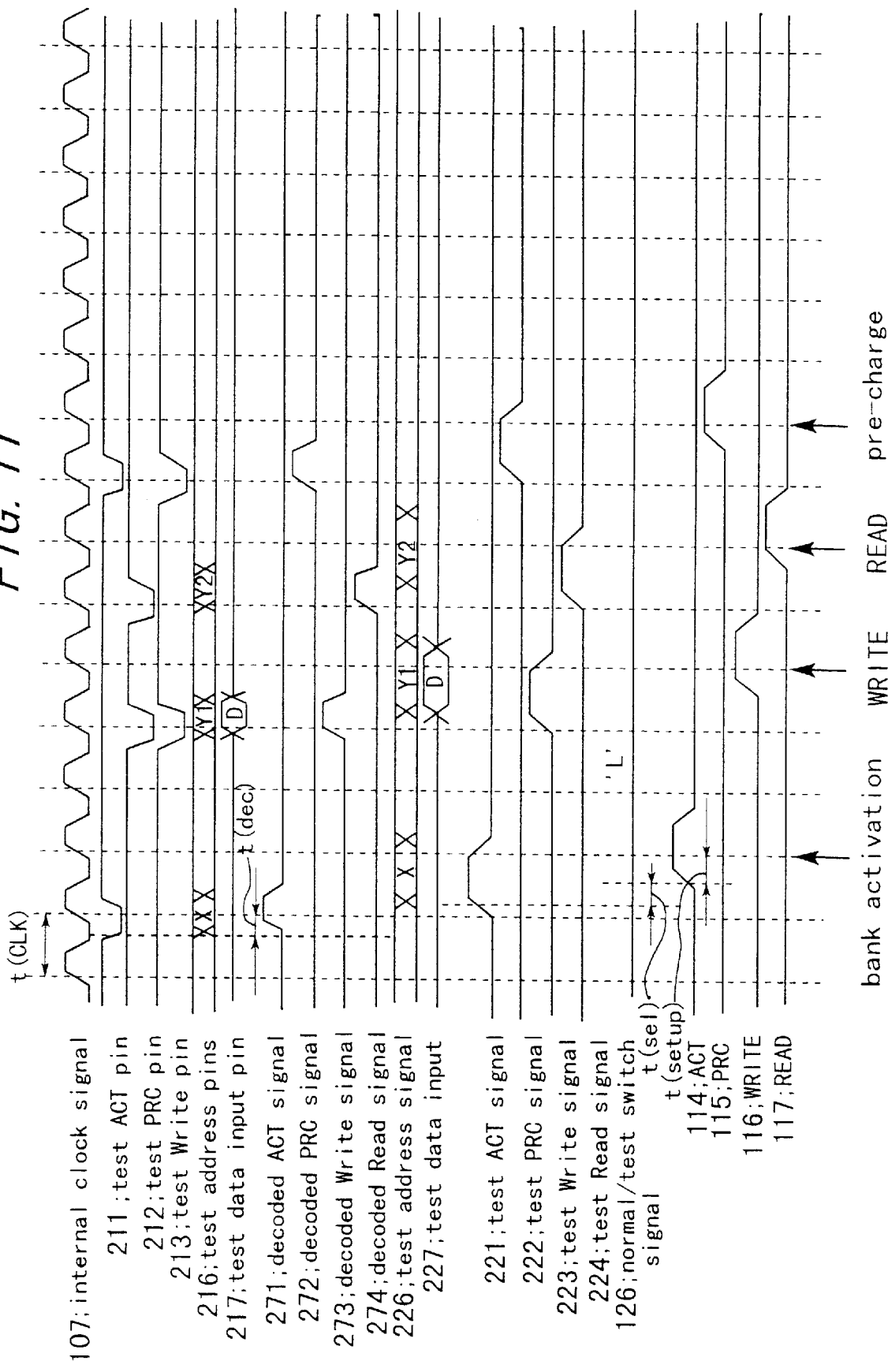
FIG. 11 comprise is a timing chart showing the operation of the semiconductor integrated circuit device of FIG. 10.

Next, a sixth embodiment of the present invention is explained by referring to FIGS. 10 and 11.

FIG. 10 is a block diagram showing a semiconductor integrated circuit device according to the sixth embodiment of the present invention. As shown in FIG. 10, the sixth embodiment is different from the third embodiment shown in FIG. 5 in that external control signals for testing, supplied by way of the test RAS pin 231, the test CAS pin 232, the test WE pin 233, the test address pins 216, and the test data input pins 217 of the external test pins 210, are decoded into internal control signals by a command decoder 240, and the decoded signals are latched in synchronization with the internal clock signal 107 in an input synchronizing latch 251 located after the command decoder 240.

FIGS. 11(A)–11(U) comprise a timing chart showing the operation of the semiconductor integrated circuit device according to the sixth embodiment of present invention shown in FIG. 10.

Much like the fourth and fifth embodiments, the sixth embodiment is effective when the pulse widths of test signals supplied to the external test pins 210 from equipment, such as a tester, are narrower than the period t(CLK) of the internal clock signal 107. In detail, test signals having respective pulse widths narrower than the "H" pulse of the internal clock signal 107 are supplied to the test RAS pin 231, the test CAS pin 232, the test WE pin 233, the test address pins 216, and the test data input pins 217. The pulse width signals supplied to the test RAS pin 231, the test CAS pin 232, the test WE pin 233, and the test address pins 216 are decoded by means of the command decoder 240 to generate a decoded ACT signal 271, a decoded PRC signal 272, a decoded Write signal 273, a decoded Read signal 274, and a decoded REF signal 275.

Then, by latching the decoded ACT signal 271, the decoded PRC signal 272, the decoded Write signal 273, the decoded Read signal 274, the decoded REF signal 275, a test signal supplied the test address pins 216, and a test signal supplied to the test data input pins 217, into the input synchronizing latch 251 in synchronization with the internal clock signal 107, however, it is possible to generate a test ACT signal 221, a test PRC signal 222, a test Write signal 223, a test Read signal 224, a test REF signal 225, a test address signal 226, and a test data input signal 227 having respective pulse widths about equal to the period t(CLK) of the internal clock signal 107.

As a result, in the sixth embodiment, even if the pulse widths of test signals supplied to the external test pins 210 from equipment such as a tester are narrower than the period t(CLK) of the internal clock signal 107, the test signals input from the external test pins 210 are latched in the input synchronizing latch 251 immediately after decoding and converted into test signals having respective longer pulse widths, allowing a stable SDRAM stand-alone test to be conducted. Thereafter, the test ACT signal 221, the test PRC signal 222, the test Write signal 223, the test Read signal 224, the test REF signal 225, the test address signal 226, and the test data input signal 227 are supplied to the input synchronizing latch 242 inside the SDRAM core 104 by way of the two-to-one selector 241.

As described above, in such a configuration, even if the pulse widths of test signals supplied to the external test pins 210 from equipment, such as a tester, are narrower than the period t(CLK) of the internal clock signal 107, the test signals input from the external test pins 210 are latched into the input synchronizing latch 251 immediately after decoding and converted into test signals having respective longer pulse widths, allowing a stable SDRAM stand-alone test to be conducted. Since there is no effect on signal paths in normal operation, high-speed operation of an interface with the SDRAM core 104 is not lost.

Since an input test signal from an external test pin is synchronized with the internal clock signal 107 when the signal is decoded, the operation of the SDRAM core 104 is delayed by one period t(CLK) of the internal clock signal 107. By writing a test program for the test equipment that generates a test signal by one period, t(CLK), of the internal clock signal 107 earlier, however, a test can be conducted without causing any problems.

As described above, the semiconductor integrated circuit device and the test method provided by the sixth embodiment makes it possible to conduct a stable SDRAM stand-alone test.

While the present invention has been described with reference to first to sixth illustrative embodiments, the description is not intended to be construed in a limiting sense. It is to be understood that the subject matter encompassed by the present invention is not limited to the embodiments. For example, in the second to sixth embodiments, described above, the external test pins 210 are separate from the external pins 101 which are dedicated solely for testing purposes. However, the external test pins 210 can be connected to the logic circuit 102 and used in normal operation if there is no need to use the external test pins 210 for testing. In addition, other external pins not shown in the figure may also be used as external test pins.

In the first to sixth embodiments, decoders are provided with the SDRAM controller. However, a command decoder can be provided in the SDRAM core 104 for decoding a signal into a command that provides no hindrance to the operation of the SDRAM core 104, even if the signal is delayed by the decoding. Such a command decoder will still result in the same effects exhibited by the described embodiments.

In addition, in the second to sixth embodiments, the normal/test switch signal 126 is output from the logic circuit as described above. As indicated in the description of the conventional technology, however, it is not necessary to output the normal/test switch signal 126 from the logic circuit. That is, the normal/test switch signal 126 can also be obtained directly from one of the external test pins.

In the embodiments described above, a SDRAM is taken as an example for the present invention. However, the present invention can be applied to other type of RAMs that incorporate command decode systems.

Obviously many modifications and variations of the present invention are possible in the light of the above teachings. It is therefore to be understood that within the scope of the appended claims the invention may by practiced otherwise than as specifically described.

What is claimed is:

1. A semiconductor integrated circuit device comprising:
   a logic circuit and a synchronous dynamic random access memory including a core unit, said logic circuit and said synchronous dynamic random access memory being integrated into a single semiconductor chip; and
   a synchronous dynamic random access memory control circuit receiving external control signals for said synchronous dynamic random access memory from said logic circuit, and outputting signals to said core unit of said synchronous dynamic random access memory wherein the output signals from said synchronous dynamic random access memory control circuit are internal control signals for controlling said core unit of said synchronous dynamic random access memory.

2. The semiconductor integrated circuit device according to claim 1 further comprising:
   external input terminal means for transmitting a first group of internal control signals for said synchronous dynamic random access memory; and
   select means for supplying internal control signals to said core unit of said synchronous dynamic random access memory, said internal control signals being obtained by selecting either the first group of internal control signals received from said external input terminal means or a second group of internal control signals received from said synchronous dynamic random access memory control circuit wherein said select means has a first mode selecting the first group of signals received from said external input terminals for testing said semiconductor integrated circuit device with the first group of signals, and a second mode selecting the second group of signals received from said synchronous dynamic random access memory control circuit.

3. The semiconductor integrated circuit device according to claim 1 further comprising:
   external input terminal means for transmitting internal control signals for said synchronous dynamic random access memory;
   synchronizing means for receiving the internal control signals from said external input terminal means and outputting a first group of internal control signals synchronized with a clock signal of said semiconductor integrated circuit; and
   select means for supplying internal control signals to said core unit of said synchronous dynamic random access memory; said internal control signals being obtained by selecting either the first group of internal control signals received from said synchronizing means or a second group of internal control signals received from said synchronous dynamic random access memory control circuit wherein said select means has a first mode selecting the first group of signals received from said synchronizing means, and a second mode selecting the second group of signals received from said synchronous dynamic random access memory control circuit.

4. The semiconductor integrated circuit device according to claim 1 further comprising:
   external input terminal means for transmitting external control signals for said synchronous dynamic random access memory;
   a command decoder for decoding the external control signals received from said external input terminal means into a first group of internal control signals for controlling said core unit of said synchronous dynamic random access memory; and select means for supplying internal control signals to said core unit of said synchronous dynamic random access memory, the internal control signals being obtained by selecting either the first group of internal control signals received from said command decoder or a second group of internal control signals received from said synchronous dynamic random access memory control circuit, wherein said select means has a first mode selecting the first group of signals received from said command decoder, and a second mode for selecting the second group of signals received from said synchronous dynamic random access memory control circuit.

5. A semiconductor integrated circuit device according to claim 1 further comprising:

external input terminal means for transmitting external control signals for said synchronous dynamic random access memory;

synchronizing means for receiving the external control signals from said external input terminal means and outputting external control signals synchronized with a clock signal of said semiconductor integrated circuit; and a command decoder for decoding the external control signals received from said synchronizing means into a first group of internal control signals for controlling said core unit of said synchronous dynamic random access memory; and select means for supplying internal control signals to said core unit of said synchronous dynamic random access memory, the internal control signals being obtained by selecting either the first group of internal control signals received from said command decoder or a second group of internal control signals received from said synchronous dynamic random access memory control circuit, wherein said select means has a first mode selecting the first group of signals received from said command decoder and a second mode selecting the second group of signals received from said synchronous dynamic random access memory control circuit.

6. The semiconductor integrated circuit device according to claim 1 further comprising:

external input terminal means for transmitting external control signals for said synchronous dynamic random access memory;

a command decoder for decoding the external control signals received from said external input terminal means into for controlling said core unit of said synchronous dynamic internal control signals random access memory;

a synchronizing means receiving the internal control signals from said command decoder for outputting a first group of internal control signals synchronized with a clock signal of said semiconductor integrated circuit; and select means for supplying internal control signals to said core unit of said synchronous dynamic random access memory, the internal control signals being obtained by selecting either the first group of internal control signals received from said synchronizing means or a second group of internal control signals received from said synchronous dynamic random access memory control circuit, wherein said select means has a first mode selecting the first signals received from said synchronizing means and a second mode selecting the second signals received from said synchronous dynamic random access memory control circuit.

7. A method for testing a semiconductor integrated circuit device said test method including the steps of comprising:

a logic circuit and a synchronous dynamic random access memory including a core unit, said logic circuit and said synchronous dynamic random access memory being integrated into a single semiconductor chip; and providing external test signals through external input terminal means to a selector;

providing internal control signals from a synchronous dynamic random access memory control circuit to a selector; and selecting said external test signals from said external input terminal means, using said selector, for providing the selected signals to a core unit of said synchronous dynamic random access memory for testing.

8. The method for testing a semiconductor integrated circuit device according to claim 7, wherein the external test signals are internal control signals for testing said core unit of said synchronous dynamic random access memory.

9. The method for testing a semiconductor integrated circuit device according to claim 7, wherein the external test signals are external control signals for said core unit of said synchronous dynamic random access memory, and is decoded by a decoder to internal control signals provided to said selector.

* * * * *